United States Patent
Fay et al.

(10) Patent No.: US 11,462,472 B2
(45) Date of Patent: Oct. 4, 2022

(54) LOW COST THREE-DIMENSIONAL STACKING SEMICONDUCTOR ASSEMBLIES

(71) Applicant: Micron Technology, Inc., Boise, ID (US)

(72) Inventors: Owen R. Fay, Meridian, ID (US); Chan H. Yoo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/985,047

(22) Filed: Aug. 4, 2020

(65) Prior Publication Data
US 2022/0044998 A1  Feb. 10, 2022

(51) Int. Cl.
| | |
|---|---|
| H01L 25/065 | (2006.01) |
| H01L 23/31 | (2006.01) |
| H01L 23/528 | (2006.01) |
| H01M 50/414 | (2021.01) |
| H05K 9/00 | (2006.01) |
| H01L 23/522 | (2006.01) |

(52) U.S. Cl.
CPC ...... *H01L 23/5226* (2013.01); *H01L 23/3114* (2013.01); *H01L 23/3121* (2013.01); *H01L 23/528* (2013.01); *H01L 25/0657* (2013.01); *H01M 50/414* (2021.01); *H05K 9/0083* (2013.01); *H01H 2227/014* (2013.01); *H01L 2224/80855* (2013.01)

(58) Field of Classification Search
CPC ...... H01H 2227/014; H03H 9/48; H03H 9/50; H03H 9/52; H01M 50/414; H01R 13/005; H05K 9/0083; H01L 2223/54486; H01L 2924/15; H01L 2933/0033; H01L 2924/153; H01L 2924/163; H01L 2224/80855; H01L 23/5226; H01L 23/3121; H01L 23/528; H01L 23/3114; H01L 33/48; H01L 25/0657

See application file for complete search history.

(56) References Cited

U.S. PATENT DOCUMENTS

| | | | |
|---|---|---|---|
| 6,765,652 B1 * | 7/2004 | Jiang | H01L 24/13 355/405 |
| 6,841,883 B1 * | 1/2005 | Farnworth | H01L 21/561 257/777 |
| 2003/0146990 A1 * | 8/2003 | Tsukamoto | H01L 27/14676 348/294 |

(Continued)

*Primary Examiner* — Galina G Yushina
(74) *Attorney, Agent, or Firm* — Perkins Coie LLP

(57) ABSTRACT

Semiconductor device package assemblies and associated methods are disclosed herein. The semiconductor device package assembly includes (1) a base component having a front side and a back side, the base component having a first metallization structure at the front side; (2) a semiconductor device package having a first side, a second side with a recess, and a second metallization structure at the first side and a contacting region exposed in the recess at the second side; (3) an interconnect structure at least partially positioned in the recess at the second side of the semiconductor device package; and (4) a thermoset material or structure between the front side of the base component and the second side of the semiconductor device package. The interconnect structure is in the thermoset material and includes discrete conductive particles electrically coupled to one another.

18 Claims, 11 Drawing Sheets

(56) References Cited

U.S. PATENT DOCUMENTS

| | | | |
|---|---|---|---|
| 2008/0157361 A1* | 7/2008 | Wood | B81B 7/0006 |
| | | | 257/738 |
| 2017/0271299 A1* | 9/2017 | Li | H01L 24/32 |
| 2019/0206736 A1* | 7/2019 | Sills | H01L 23/5226 |
| 2020/0176419 A1* | 6/2020 | Dabral | H01L 25/50 |
| 2020/0373333 A1* | 11/2020 | Liang | H01L 27/124 |

* cited by examiner

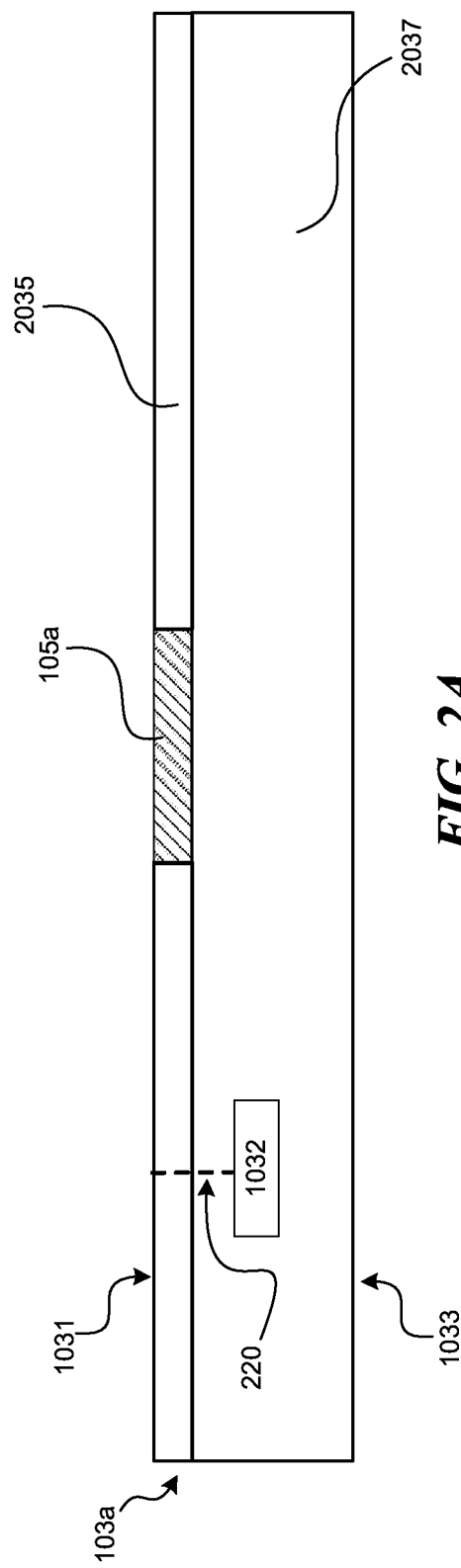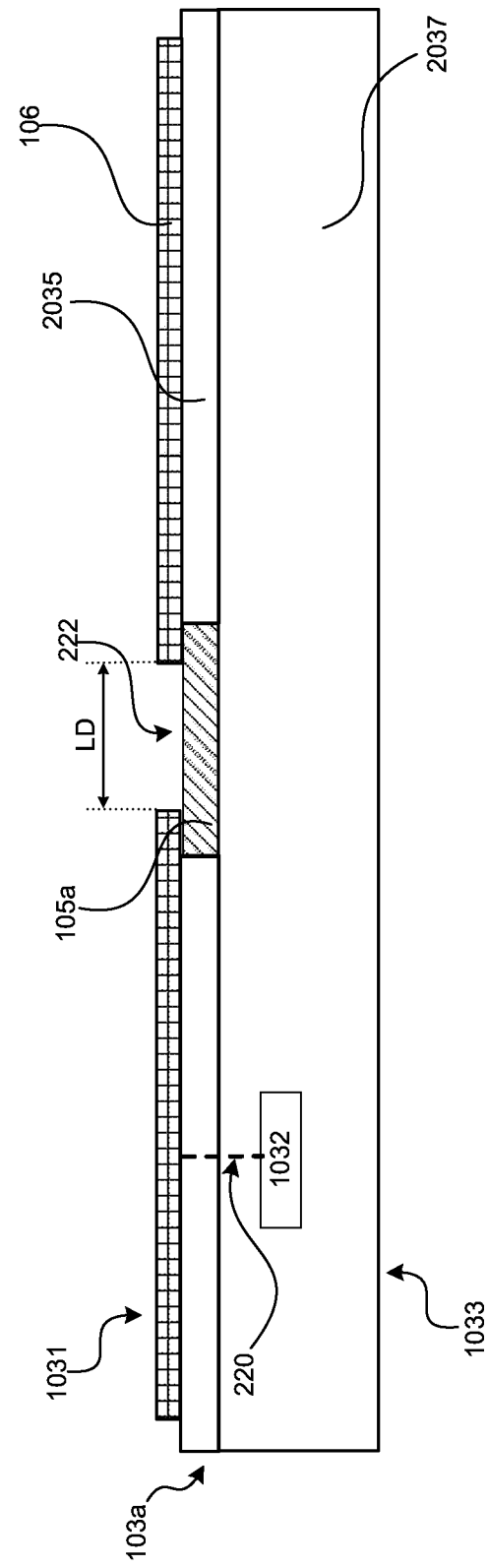

LOW COST THREE-DIMENSIONAL STACKING SEMICONDUCTOR ASSEMBLIES

TECHNICAL FIELD

The present technology is directed to semiconductor assemblies having stackable semiconductor packages therein. More particularly, some embodiments of the present technology relate to semiconductor assemblies manufactured by a three-dimensional stacking (3DS) process. In such embodiments, the semiconductor packages are directly, electrically coupled to one another without using through-silicon vias (TSVs).

BACKGROUND

Packaged semiconductor dies, including memory chips, microprocessor chips, logic chips and imager chips, typically include a semiconductor die mounted on a substrate and encased in a plastic protective covering. Individual semiconductor die can include functional features, such as memory cells, processor circuits, imager devices and other circuitry, as well as bond pads electrically connected to the functional features. Semiconductor manufacturers continually reduce the size of die packages to fit within the space constraints of electronic devices. One approach for increasing the processing power of a semiconductor package is to vertically stack multiple semiconductor dies on top of one another in a single package. The dies in such vertically-stacked packages can be electrically interconnected by using TSVs, which require multiple processing steps, such as photolithography.

BRIEF DESCRIPTION OF THE DRAWINGS

Many aspects of the present technology can be better understood with reference to the following drawings. The components in the drawings are not necessarily to scale. Instead, emphasis is placed on illustrating the principles of the present technology.

FIGS. 2A-2H are schematic cross-sectional views illustrating stages of a method of forming a semiconductor device package in accordance with the present technology.

DETAILED DESCRIPTION

Specific details of several embodiments of stacked semiconductor die packages and methods of manufacturing such die packages are described below. The term "semiconductor device" generally refers to a solid-state device that includes one or more semiconductor materials. A semiconductor device can include, for example, a semiconductor substrate or wafer, or a die that is singulated from a wafer or substrate.

Throughout the disclosure, semiconductor dies are generally described in the context of semiconductor devices but are not limited thereto.

The term "semiconductor device package" can refer to an arrangement with one or more semiconductor devices incorporated into a common package. A semiconductor package can include a housing or casing that partially or completely encapsulates at least one semiconductor device. The term "semiconductor device package assembly" can refer to an assembly that includes multiple stacked semiconductor device packages. As used herein, the terms "vertical," "lateral," "upper," and "lower" can refer to relative directions or positions of features in the semiconductor device or package in view of the orientation shown in the Figures. These terms, however, should be construed to include semiconductor devices having other orientations, such as inverted or inclined orientations.

Figure 1:
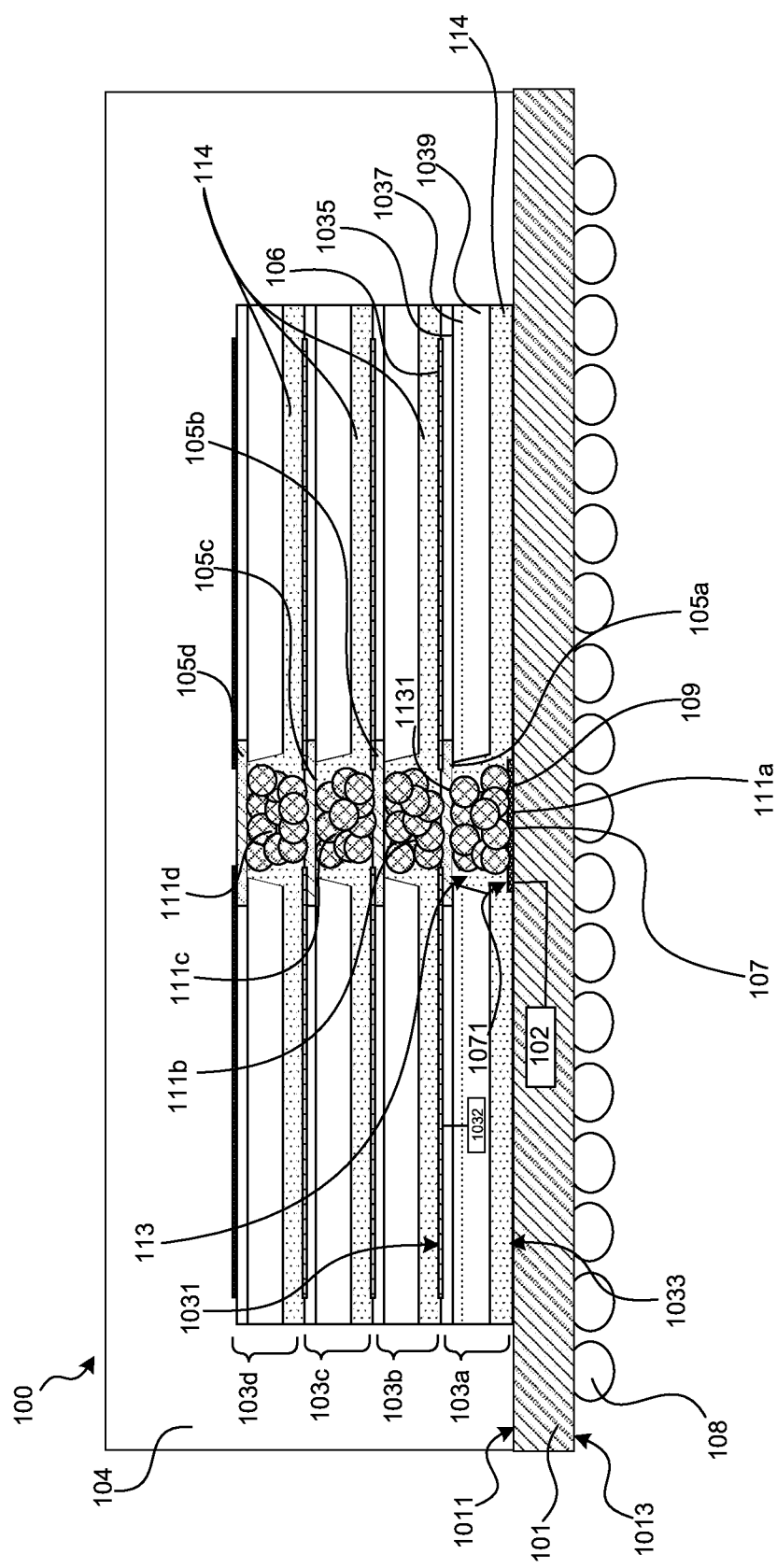
FIG. 1 is a schematic cross-sectional view of a semiconductor device package assembly in accordance with the present technology.

FIG. 1 is a schematic cross-sectional view of a semiconductor device package assembly 100 in accordance with an embodiment of the present technology. As shown, the semiconductor device package assembly 100 includes a base component 101 and multiple semiconductor device packages 103 (four semiconductor device packages 103a-d are shown in FIG. 1 as an example) stacked on the base component 101. Although the illustrated embodiment shows only four separate, stacked semiconductor device packages 103, it will be appreciated that the semiconductor device package assembly 100 can include any suitable number of stacked semiconductor device packages 103 in other embodiments. The semiconductor device package assembly 100 includes an encapsulant material 104 covering the base component 101 and the semiconductor device packages 103. In some embodiments, the encapsulant material 104 can include resin, plastic, silicon, oxide, polymer, or other suitable dielectric materials.

The semiconductor device package assembly 100 has a vertically compact design. For example, the base component 101 and the multiple semiconductor device packages 103 are directly stacked together such that a Bond Line Thickness (BLT) between the multiple semiconductor device packages 103 can be very small. In some embodiments, the BLT between the base component 101 and the adjacent semiconductor device package 103 can be negligible or near zero.

The base component 101 includes a base metallization structure 107 electrically coupled to a semiconductor component 102 (e.g., integrated circuitry) in the base component 101. The base component 101 can be a circuit board or other type of substrate commonly used in semiconductor device packages or the base component 101 can be a semiconductor device, such as a logic device, memory device, or processor. As shown, the base component 101 has a first side 1011 (e.g., a front/active side) and a second side 1013 (e.g., a back/inactive side) opposite the first side 1011. The base component 101 can be further coupled to an external component via discrete conductive connectors 108 (e.g., solder balls).

As shown in FIG. 1, the semiconductor device packages 103 are electrically coupled to one another and the base component 101 via interconnect structures 111 (four interconnect structures 111a-d are shown in FIG. 1 as an example). Each of the semiconductor device packages 103 has a metallization structure 105 (four metallization structures 105a-d are shown in FIG. 1 as an example) configured to be electrically coupled to the interconnect structures 111. As shown, the (lowest) interconnect structure 111a is electrically coupled to the base metallization structure 107 at a contacting area 1071 of the base metallization structure 107.

By this arrangement, the base component 101 and the semiconductor device packages 103 can be electrically coupled via the interconnect structures 111 without using TSVs.

In some embodiments, the base metallization structure 107 can be a metal pad (e.g., an aluminum pad). In other embodiments, the base metallization structure 107 can include copper or other suitable metals or conductive materials. The base metallization structure 107 can include one or more metallization layers defining traces, vias and/or planes.

In the illustrated embodiment, the base metallization structure 107 extends from the surface of the base component 101 at the front side 1011. In other embodiments, the base metallization structure 107 can (i) be flush with the surface of the base component 101 at the front side 1011, or (ii) be embedded in the base component 101, with the contacting area 1071 exposed for coupling with the (lowest) interconnect structure 111*a*.

Each of the interconnect structures 111 can include discrete conductive particles 109 that are electrically coupled to one another. The conductive particles 109 are discrete elements in the sense that they are separate components that can be moved to contact each other as shown. The conductive particles 109 are in a thermoset material 114, which can be a polymer-based fluid material that can become solid or be hardened when it is heated, placed under pressure, treated with a chemical, and/or affected by radiation. The thermoset material 114 can include resin, plastic, and/or other suitable thermosetting materials. As shown in FIG. 1, the base component 101 and the semiconductor device packages 103 are separated by the thermoset materials 114, respectively. The interconnect structures 111 and the formations of the thermoset materials 114 can be formed by using a solder anisotropic-conductivity-paste (ACP) or a solder anisotropic-conductivity-film (ACF). Associated methods are discussed in detail below with reference to FIGS. 2E-2H.

In the illustrated embodiments shown in FIG. 1, individual semiconductor device packages 103 have a first side 1031 (e.g., a front/active/face side) and a second side 1033 (e.g., a back/inactive side) opposite to the first side 1031. As shown, the individual semiconductor device packages 103 can include a passivation layer 1035 at the first side 1031 of the semiconductor device package 103 to protect the semiconductor device package 103. In some embodiments, the passivation layer 1035 can include an oxide layer, an inert layer (e.g., a layer that is less likely to chemically react with air or corrode), or other suitable protective layers. The passivation layer 1035 can alternatively be a pre-formed protective film.

In the illustrated embodiments, the individual metallization structure 105*a* of the semiconductor device package 103*a* is in the passivation layer 1035. The semiconductor device package 103*a* includes a first semiconductor region 1037 and a second semiconductor region 1039. In some embodiments, the first semiconductor region 1037 can include a complementary metal-oxide-semiconductor (CMOS), a logic circuit, a control circuit, and/or other suitable component. In some embodiments, the second semiconductor region 1039 can include a memory component such as a NAND memory component, a dynamic-random-access-memory (DRAM) component (e.g., a master DRAM component or a slave master DRAM component), a low-power (LP) DRAM component, a stackable cross-point (SXP) memory component, etc. In some embodiments, the first semiconductor region 1037 and the second semiconductor region 1039 can be implemented as a single semiconductor layer.

The individual semiconductor device packages 103 can also include a redistribution structure 106 positioned at the first side 1031 of the semiconductor device package 103. The redistribution structure 106 is electrically coupled to the metallization structure 105 (element 105*a* of the semiconductor device packages 103*a*), and therefore further electrically coupled to the interconnect structures 111. The redistribution structure 106 can be further electrically coupled to a semiconductor component 1032 (e.g., integrated circuitry, etc.) in the second semiconductor region 1039 of the semiconductor device package 103*a*.

The semiconductor device package 103 is formed with a recess 113 (or a divot, a cavity, or a trench) at the second side 1033. The recess 113 exposes the metallization structure 105*a* at the second side 1033 to expose a contacting region 1131. At least a portion of the interconnect structure 111*a* can reside in the recess 113 and be electrically coupled to the metallization structure 105*a* at the contacting region 1131. In some embodiments, the recess 113 can be formed by laser ablating, plasma drilling, etching, photolithography, and/or other suitable processes. In some embodiments, the recess 113 can be formed during a "line-scribing" or "street-sawing" process (e.g., a process to cut a wafer into multiple dies).

As shown in FIG. 1, at least a portion of the interconnect structure 111*a* is positioned in the recess 113. By this arrangement, the present technology enables the base component 101 to be electrically coupled to the semiconductor device packages 103 without using TSVs in either the base component 101 or the semiconductor device packages 103.

In some embodiments, the metallization structure 105 can include layers of aluminum, copper, or other suitable metals or conductive materials. The metallization structure 105 can be formed during a back-end-of-line (BEOL) manufacturing process and include multiple layers of traces, vias or other electrical features.

In some embodiments, the semiconductor device package assembly 100 can be a memory device in which the semiconductor device packages 103 are memory dies (e.g., DRAM, LPDRAM, SRAM, Flash, etc.). In some embodiments, the base component 101 can be a logic device, processor, and/or another memory device.

Figure 2C:
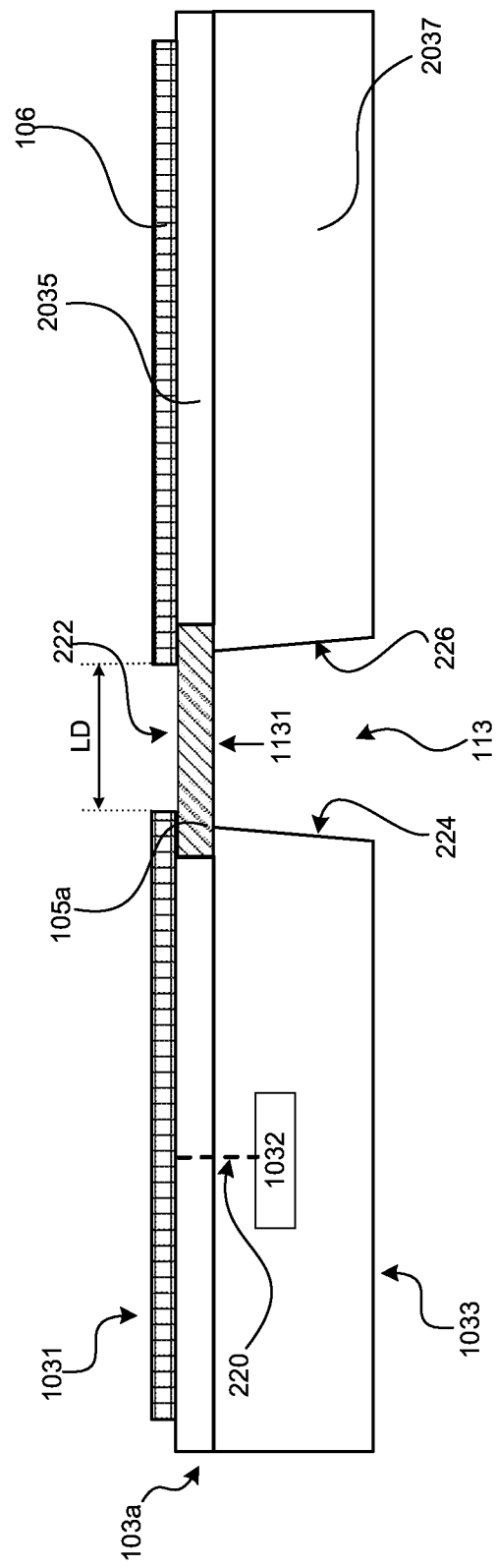

FIGS. 2A-2H are schematic cross-sectional views of stages of a method for manufacturing embodiments of the semiconductor device package 103*a* in accordance with the present technology. Like reference numbers refer to like components throughout FIGS. 2A-2H. Referring to FIG. 2A, at this stage of the method, the semiconductor device package 103*a* has a first side 1031 (e.g., a front/active side) and a second side 1033 (e.g., a back/inactive side) opposite to the first side 1031. The semiconductor device package 103*a* includes a substrate 2037 and a dielectric material 2035 on the substrate 2037. The semiconductor device package 103*a* includes the metallization structure 105*a* which can be formed during a BEOL manufacturing process to be in the dielectric material 2035. The semiconductor component 1032 can be in and/or on the substrate 2037 and electrical coupled to a vertical via 220. The vertical via 220 extends from the semiconductor component 1032 and through the dielectric material 2035. At this stage, the semiconductor component 1032 is not electrically coupled to the metallization structure 105*a*.

FIG. 2B shows the semiconductor device package 103*a* after a redistribution structure 106 has been formed at the first side 1031 of the semiconductor device package 103*a*. The redistribution structure 106 is electrically coupled to the metallization structure 105*a* and the vertical via 220 to electrically couple the semiconductor component 1032 to the metallization structure 105a. The redistribution structure 106 is formed with a front-side opening 222 at the first side 1031 of the semiconductor device package 103 to expose the metallization structure 105a. In some embodiments, the lateral dimension LD of the front-side opening 222 can be about 40 µm, or in other embodiments, the lateral dimension LD can range from 10 µm to 50 µm.

FIG. 2C shows the semiconductor device package 103a after a recess 113 has been formed in the substrate 2037 at the second side 1033. The recess 113 can extend completely through the substrate 2037 such that the metallization structure 105a is exposed at the second side 1033 to form a contacting region 1131. The recess 113 can have sloped first and second sidewalls 224, 226, respectively. The sloped first and second sidewalls 224, 226 can facilitate forming an interconnect structure 111 in the recess 113 by enabling conductive particles in a thermoset material to flow toward the contacting region 1131. The process of forming the interconnect structure 111a is discussed below in detail with reference to FIGS. 2E-2H. In some embodiments, the slopes of the first and second sidewalls 224, 226 can be generally the same, or the slopes of the first and second sidewalls 224, 226 can be different.

Figure 2D:
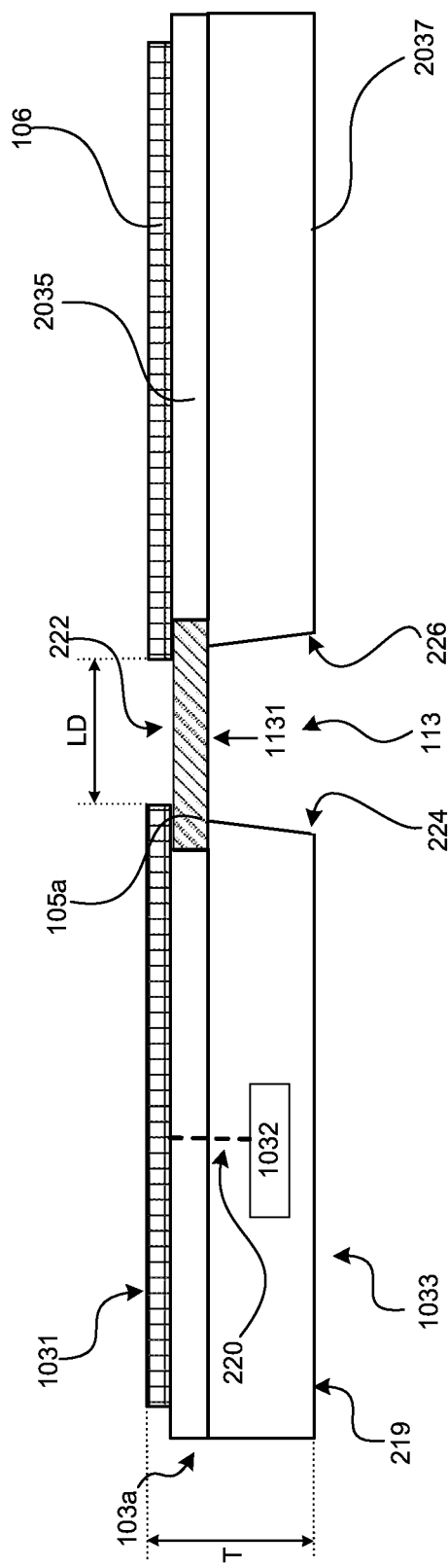

FIG. 2D illustrates the semiconductor device package 103a after the substrate 2037 has been thinned. The substrate 2037 can be thinned such that the semiconductor device package 103a has a thickness T between a thinned surface 219 and the first side 1031 of the semiconductor device package 103a. In some embodiments, the thickness T can range from 5-30 µm, and for example not more than 30 µm, 25 µm, 20 µm, 15 µm, 10 µm or 5 µm. At this stage of the process, the semiconductor device packages 103 can be stacked on a base component (FIGS. 2E and 2F) or on each other (FIGS. 2G and 2H).

By thinning the substrate 2037 to this extent, the metallization structure 105a of the semiconductor device package 103a can be accessed and electrically coupled to other metallization structures or semiconductor components of stacked semiconductor device packages without using TSVs. Generally speaking, to form a TSV in a semiconductor structure, the smallest thickness of the semiconductor substrate can be around 50 µm. This is 200%-1000% thicker than the semiconductor device package 103a of the present technology. Therefore, the improved method provided by the present technology is advantageous at least because it provides semiconductor device packages with smaller thicknesses (or vertical dimensions) and enables stacking without forming TSVs. It is particularly beneficial for manufacturing compact semiconductor devices or packages.

Figure 2E:
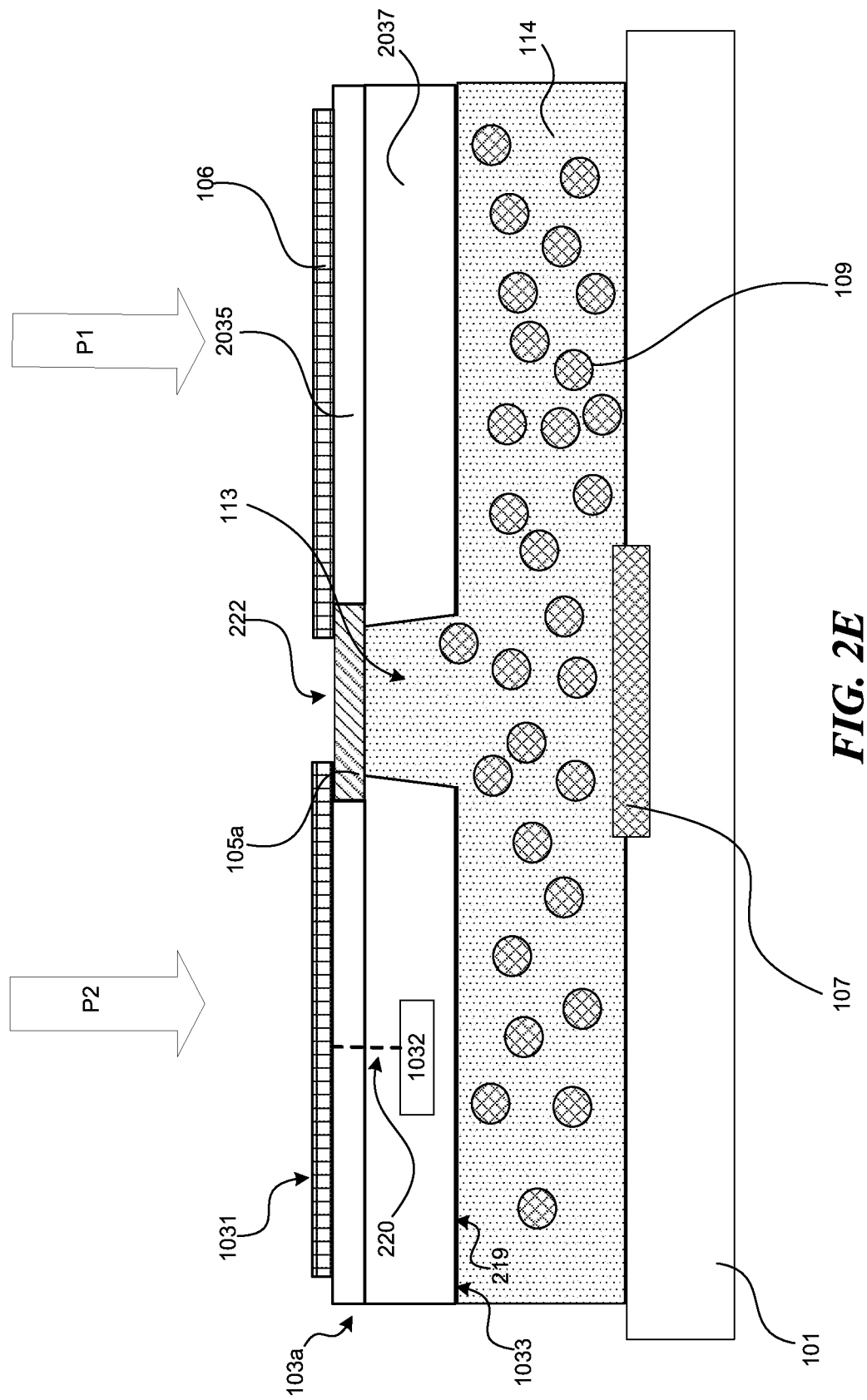

FIG. 2E shows a stage of the process of forming an interconnect structure (e.g., the interconnect structure 111a in FIG. 1) between the semiconductor device package 103a and a base component (e.g., the base component 101 in FIG. 1). As shown, a thermoset material 114 is positioned between the semiconductor device package 103a and the base component 101. The thermoset material 114 can be a polymer-based fluid material that can become solid or be hardened when it is heated, placed under pressure, treated with a chemical, and/or irradiated. The thermoset material 114 can include resin, plastic, and/or other suitable thermosetting materials. As shown, conductive particles 109, such as metal particles or carbon nanotubes, are disposed in the thermoset material 114. The conductive particles 109 are (generally) evenly distributed in the thermoset material 114 at this stage. The conductive particles 109 can be solder particles. In some embodiments, the conductive particles 109 can be other metal particles or other suitable conductive particles. In some embodiments, the thermoset material 114 can be a solder ACP or ACF manufactured by Sekisui Chemical Co. LTD, at Tokyo, Japan.

To form the interconnect structure 111a, pressure can be applied on the semiconductor device package 103a in directions P1 and P2. By doing so, the conductive particles 109 flow toward the center of the thermoset material 114 and are then retained in the recess 113. The conductive particles 109 in the recess 113 then start to couple with one another to form the interconnect structure 111a. In the illustrated embodiment, the directions P1 and P2 can be generally in parallel. In some embodiments, the directions P1 and P2 are not in parallel, depending on various factors such as the distribution of particles in the thermoset material 114, the location of the semiconductor component 1032, etc. In some embodiments, heat or a magnetic field can be applied during this stage to facilitate the flow of the conductive particles 109.

Figure 2F:
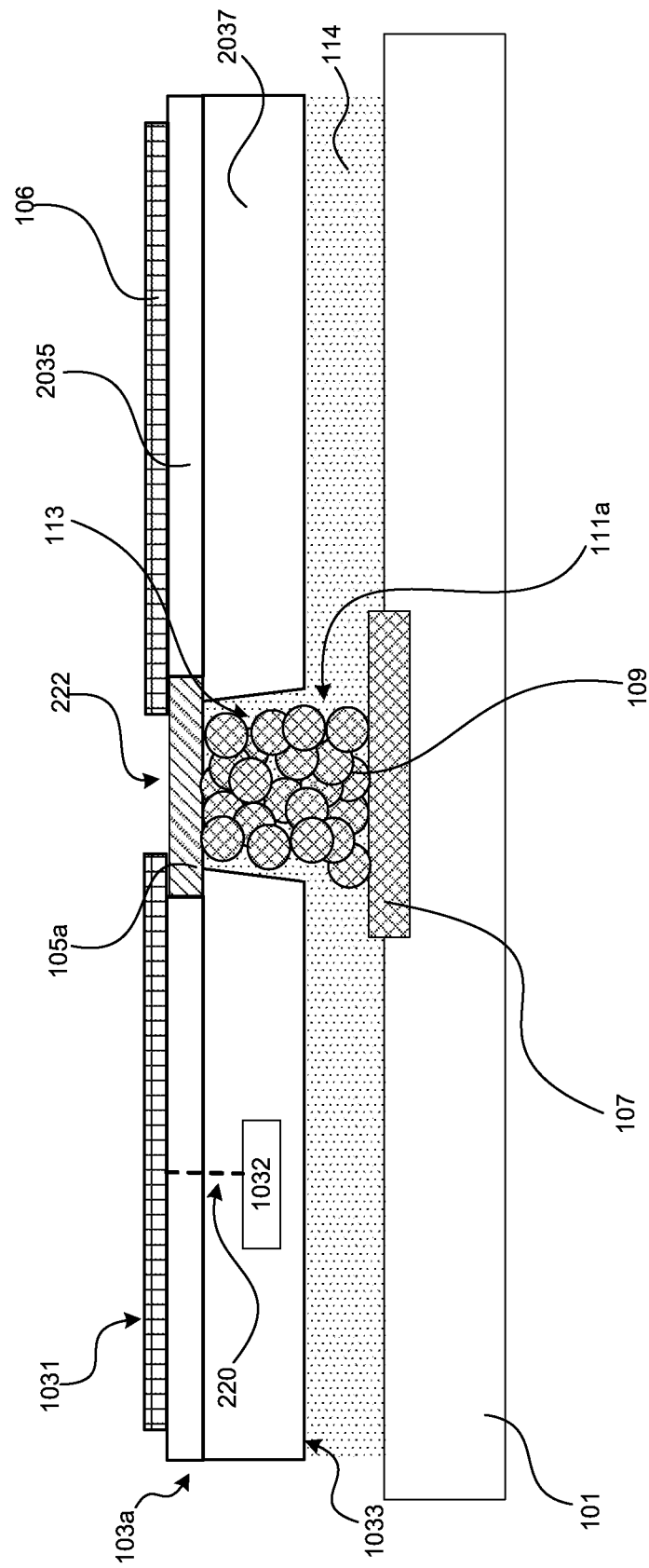
Figure 2G:
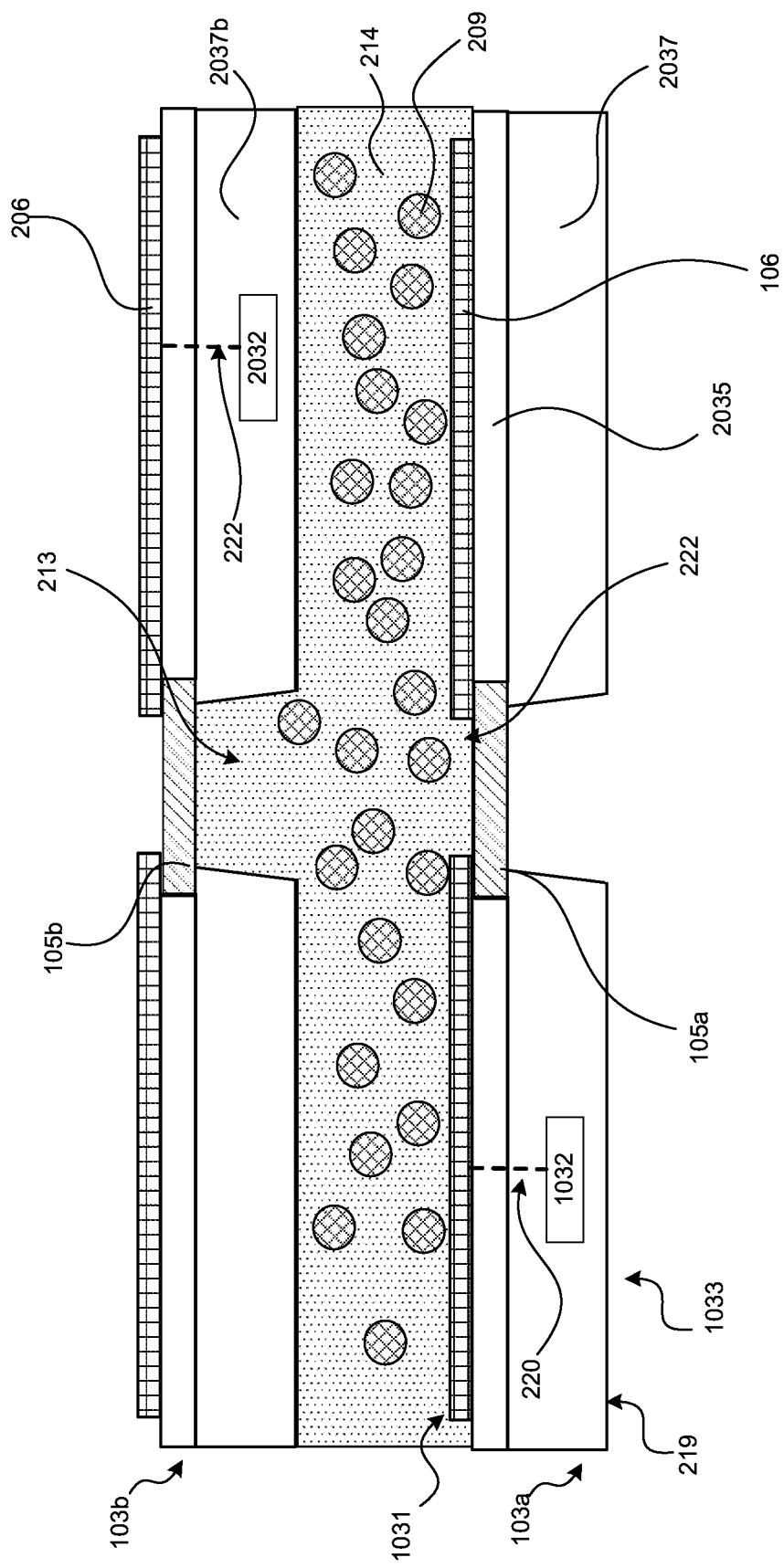
Figure 2H:
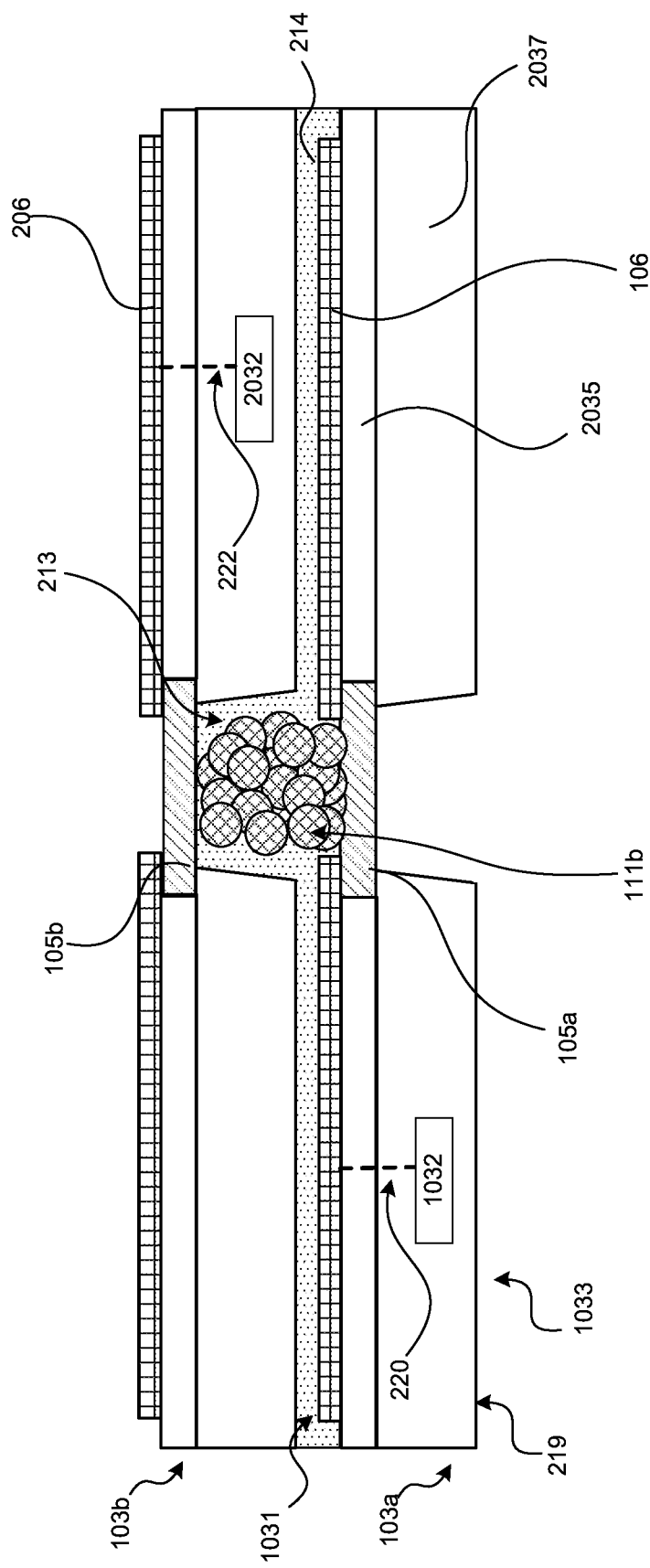

FIG. 2F shows a stage of the process that the interconnect structure 111a has been formed between the semiconductor device package 103a and the base component 101. As shown, at least a portion of the conductive particles 109 are in the recess 113. The semiconductor device package 103a and the base component 101 are thus electrically coupled by the interconnect structure 111a. For example, the semiconductor component 1032 in the semiconductor device package 103a can be electrically coupled to the base metallization structure 107 via the interconnect structure 111a, the metallization structure 105a, the redistribution structure 106, and the vertical via 220.

FIG. 2G shows a stage of the process of forming an interconnect structure (e.g., the interconnect structure 111b in FIG. 1) between the semiconductor device package 103a and another semiconductor device package (e.g., the semiconductor device package 103b in FIG. 1). The semiconductor device package 103b has a metallization structure 105b at its front side and a recess 213 at its back side. The metallization structure 105b is electrically coupled to a redistribution structure 206, which is electrically coupled to a semiconductor component 2032 in the semiconductor device package 103b by a vertical via 222. The recess 213 exposes the metallization structure 105b from the back side.

As shown, a thermoset material 214 is positioned between the semiconductor device packages 103a, 103b. The thermoset material 214 can be a polymer-based fluid film or paste, and conductive particles 209 are distributed (e.g., evenly distributed) in the thermoset material 214. The conductive particles 209 can be solder particles. In some embodiments, the conductive particles 209 can be metal particles or other suitable conductive particles (e.g., carbon nanotubes). To form the interconnect structure 111b, pressure, heat, and/or magnetic fields can be applied on the semiconductor device packages 103a, 103b such that the conductive particles 209 move toward the center of the thermoset material 214 and are positioned (or retained) in the recess 213. The conductive particles 209 in the recess 213 are electrically and physically coupled with one another so as to form the interconnect structure 111b.

FIG. 2H shows a stage of the process after the interconnect structure 111b has been formed between the semiconductor device packages 103a, 103b. As shown, the interconnect structure 111b is formed in the recess 213 by at least a portion of the conductive particles 209 in the thermoset material 214. Via the interconnect structure 111b, the semiconductor device packages 103a, 103b are electrically coupled. For example, the semiconductor component 1032 in the semiconductor device package 103*a* can be electrically coupled to the semiconductor component 2032 in the semiconductor device package 103*b* via the interconnect structure 111*b*, the metallization structures 105*a*, 105*b*, the redistribution structures 106, 206, and the vertical vias 220, 222.

Figure 3:
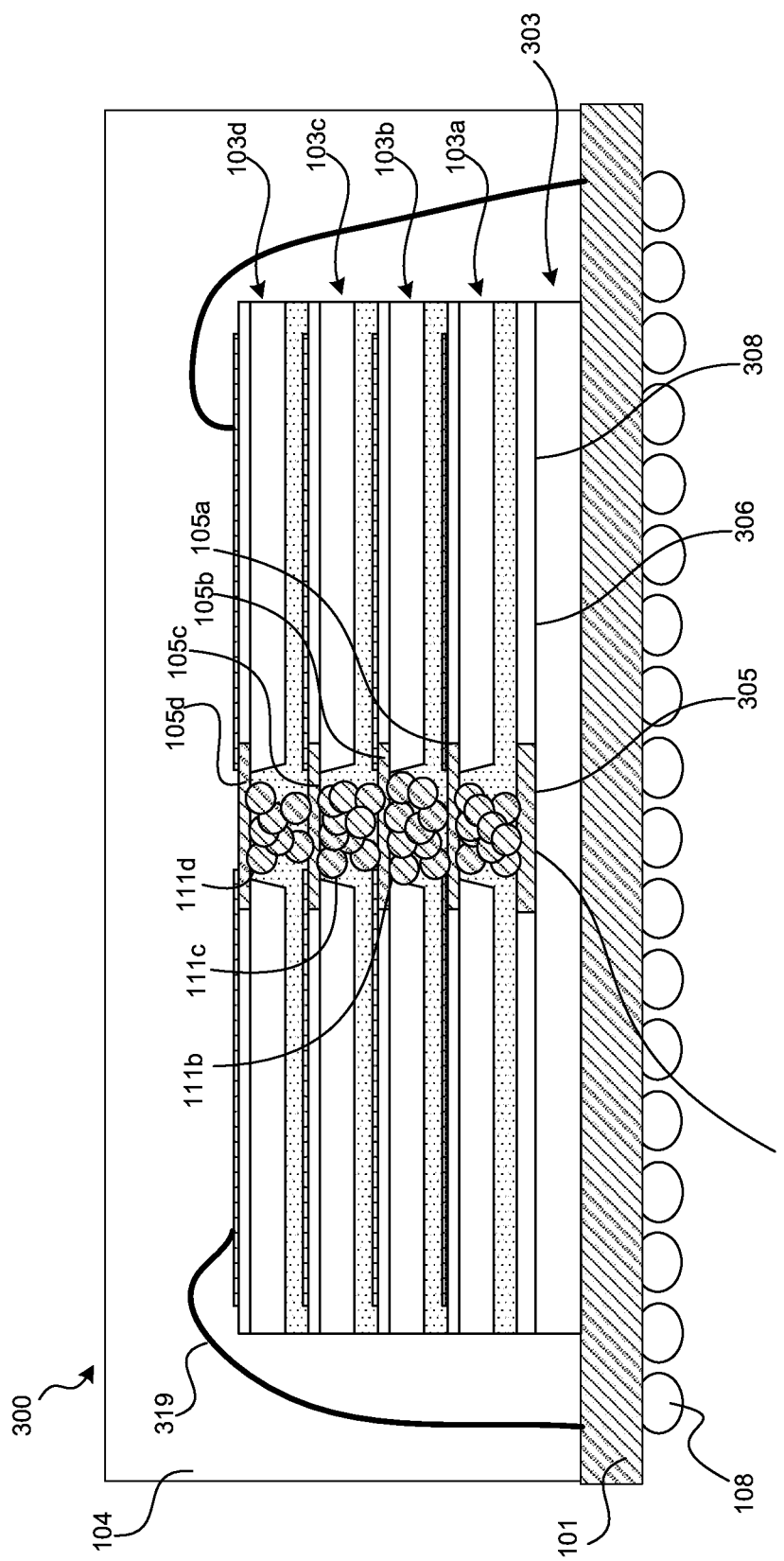
FIG. 3 is a schematic cross-sectional view illustrating a semiconductor device package assembly in accordance with the present technology.

FIG. 3 is a schematic cross-sectional view illustrating a semiconductor device package assembly 300 in accordance with the present technology. Compared to the semiconductor device package assembly 100 described in FIG. 1, the semiconductor device package assembly 300 further includes an intermediate semiconductor device package 303 between the base component 101 and the stacked semiconductor device packages 103*a*-103*d*. The intermediate semiconductor device package 303 has a structure similar to those of the stacked semiconductor device packages 103*a*-103*d*, except for that the intermediate semiconductor device package 303 does not have a recess at its back side. The intermediate semiconductor device package 303 has a metallization layer 305 electrically coupled to the metallization structures 105*a*-*d* in the stacked semiconductor device packages 103*a*-103*d* by interconnect structures 111*a*-*d*. As shown, the metallization layer 305 can be further electrically coupled to the base component 101 via one or more bonding wires 319. The semiconductor device package assembly 300 includes an encapsulant material 304 covering the base component 101, the intermediate semiconductor device package 303, the stacked semiconductor device packages 103*a*-*d*, and the bonding wires 319.

Figure 4:
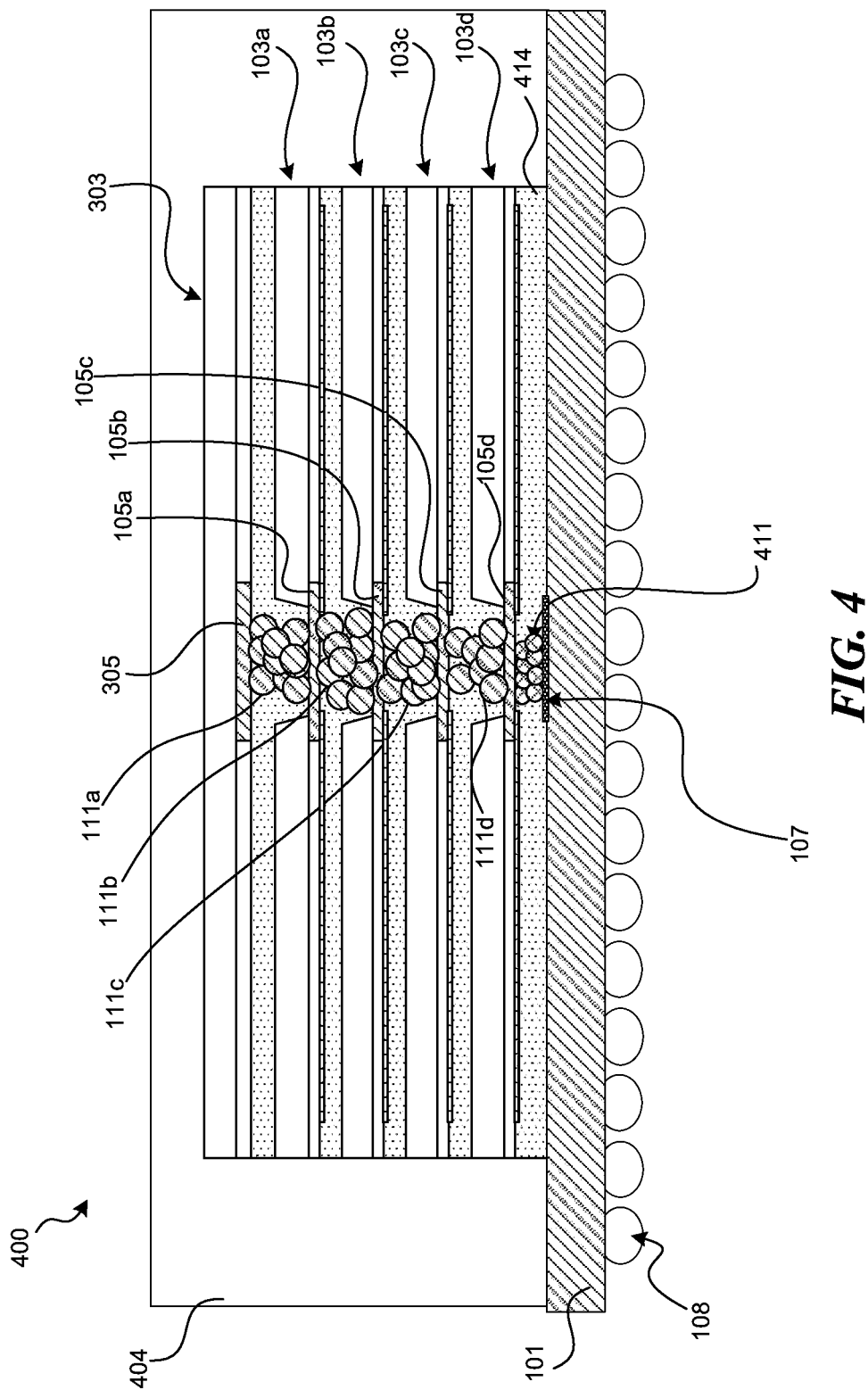
FIG. 4 is a schematic cross-sectional view illustrating another semiconductor device package assembly in accordance with the present technology.

FIG. 4 is a schematic cross-sectional view illustrating a semiconductor device package assembly 400 in accordance with the present technology. Compared to the semiconductor device package assembly 300 described in FIG. 3, the semiconductor device package assembly 400 has an "inverted" arrangement. More particularly, the stacked semiconductor device packages 103*a*-103*d* and the intermediate semiconductor device package 303 are "inverted" such that the semiconductor device package 103*d* is the "closest" semiconductor device package relative to the base component 101 (in FIG. 3, the semiconductor device package 103*d* is the "farthest" semiconductor device package relative to the base component 101). As shown, the metallization structure 105*d* of the semiconductor device package 103*d* can be electrically coupled to the base metallization structure 107 (see, e.g., FIG. 1) of the base component 101 by an interconnect structure 411 in a resin structure 414. By this arrangement, the metallization layer 305 of the intermediate semiconductor device package 303 can be electrically coupled to the base metallization structure 107 of the base component 101 without using TSVs or bonding wires.

Figure 5:
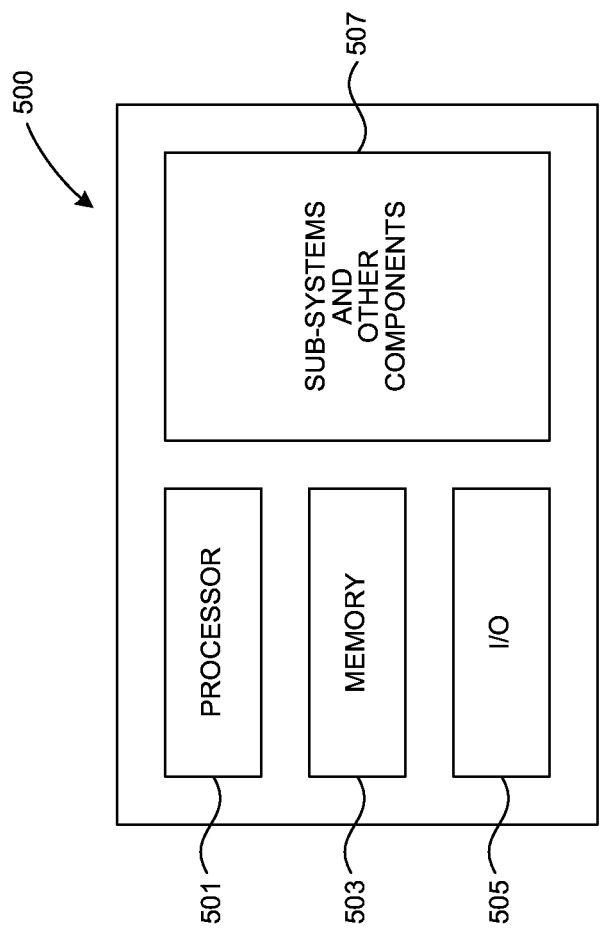
FIG. 5 is a block diagram illustrating a system that incorporates a semiconductor assembly in accordance with the present technology.

Any one of the semiconductor devices having the features described above with reference to FIGS. 1-4 can be incorporated into any of a myriad of larger and/or more complex systems, a representative example of which is a system 500 shown schematically in FIG. 5. The system 500 can include a processor 501, a memory 503 (e.g., SRAM, DRAM, flash, and/or other memory devices), input/output devices 505, and/or other subsystems or components 507. The semiconductor assemblies, devices, and device packages described above with reference to FIGS. 1-4 can be included in any of the elements shown in FIG. 5. The resulting system 500 can be configured to perform any of a wide variety of suitable computing, processing, storage, sensing, imaging, and/or other functions. Accordingly, representative examples of the system 500 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 500 include lights, cameras, vehicles, etc. With regard to these and other examples, the system 500 can be housed in a single unit or distributed over multiple interconnected units, e.g., through a communication network. The components of the system 500 can accordingly include local and/or remote memory storage devices and any of a wide variety of suitable computer-readable media.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of other features are not precluded. Reference herein to "one embodiment," "some embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

From the foregoing, it will be appreciated that specific embodiments of the present technology have been described herein for purposes of illustration, but that various modifications may be made without deviating from the scope of the invention. The present technology is not limited except as by the appended claims.

We claim:

1. A semiconductor device package assembly, comprising:
- a base component having a front side and a back side, the base component having a first metallization structure at the front side;
- a semiconductor device package having a first side, a second side with a recess, and a second metallization structure at the first side and a contacting region exposed in the recess at the second side; and
- an interconnect structure at least partially positioned in the recess at the second side of the semiconductor device package, wherein the interconnect structure includes discrete conductive particles electrically coupled to one another, and wherein a first subset of the discrete conductive particles of the interconnect structure are directly coupled to the second metallization structure at the contacting region, and wherein a second subset of the discrete conductive particles of the interconnect structure are directly coupled to the first metallization structure; and
- a thermoset material between the front side of the base component and the second side of the semiconductor device package, wherein the discrete conductive particles are in the thermoset material.

2. The semiconductor device package assembly of claim 1, wherein the semiconductor device package is electrically coupled to the base component via the first and second metallization structures exclusive of any through-silicon vias.

3. The semiconductor device package assembly of claim 1, wherein the semiconductor device package includes a passivation layer at the first side, and wherein the second metallization structure is in the passivation layer.

4. The semiconductor device package assembly of claim 3, wherein the semiconductor device package includes a redistribution structure on the passivation layer, and wherein the redistribution structure is electrically coupled to the second metallization structure.

5. The semiconductor device package assembly of claim 1, wherein the first metallization structure includes an aluminum bond pad.

6. The semiconductor device package assembly of claim 1, wherein the semiconductor device package includes a complementary metal-oxide-semiconductor (CMOS) at the first side and a memory component at the second side.

7. The semiconductor device package assembly of claim 6, wherein the memory component includes one of the following: a NAND memory component, a dynamic-random-access-memory (DRAM) component, a low-power DRAM component, or a stackable cross-point (SXP) memory component.

8. The semiconductor device package assembly of claim 1, wherein the interconnect structure has a lateral dimension less than 40 μm where it contacts the first metallization structure.

9. The semiconductor device package assembly of claim 1, wherein the interconnect structure has a lateral dimension less than 20 μm where it contacts the first metallization structure.

10. The semiconductor device package assembly of claim 1, wherein the recess is defined by the contacting region, a first sidewall, and a second sidewall opposite the first sidewall.

11. The semiconductor device package assembly of claim 1, wherein the semiconductor device package has a vertical dimension less than 30 μm.

12. The semiconductor device package assembly of claim 1, wherein the semiconductor device package has a vertical dimension less than 10 μm.

13. A semiconductor device package assembly, comprising:
- a first semiconductor device package having a front side and a back side, the first semiconductor device package having a first metallization structure at the front side and a first substrate at the back side, the first metallization structure being exposed from the back side via a cavity;
- a second semiconductor device package having a first side and a second side, the second semiconductor device package having a second metallization structure at the first side and a second substrate at the second side;
- an interconnect structure at least partially positioned in the cavity, wherein the interconnect structure includes discrete conductive particles electrically coupled to one another, and wherein a first subset of the discrete conductive particles of the interconnect structure are directly coupled to the first metallization structure, and wherein a second subset of the discrete conductive particles of the interconnect structure are directly coupled to the second metallization structure; and
- a resin structure between the back side of the first semiconductor device package and the first side of the second semiconductor device package, wherein the discrete conductive particles are in the resin structure.

14. The semiconductor device package assembly of claim 13, wherein the first and second semiconductor device packages have a vertical dimension less than 10 μm.

15. The semiconductor device package assembly of claim 13, wherein the interconnect structure has a lateral dimension less than 20 μm both where it contacts the first metallization structure and where it contacts the second metallization structure.

16. The semiconductor device package assembly of claim 13, wherein the first semiconductor device package is electrically coupled to the second semiconductor device package via the first and second metallization structures exclusive of any through-silicon vias.

17. A semiconductor device package assembly, comprising:
- a base component having a front side and a back side, the base component having a first metallization structure at the front side;
- a semiconductor device package having a first side with a contacting area, a second side with a recess, and a second metallization structure at the first side and a contacting region exposed in the recess at the second side; and
- a thermoset structure between the front side of the base component and the first side of the semiconductor device package; and
- an interconnect structure having discrete conductive particles electrically coupled to one another, wherein the interconnect structure is in the thermoset structure, and wherein a first subset of the discrete conductive particles of the interconnect structure are directly coupled to the second metallization structure at the contacting area, and wherein a second subset of the discrete conductive particles of the interconnect structure are directly coupled to the first metallization structure.

18. The semiconductor device package assembly of claim 17, wherein the interconnect structure is a first interconnect structure, and wherein the semiconductor device package is a first semiconductor device package, and wherein the thermoset structure is a first thermoset structure, and wherein the discrete conductive particles are a first set of conductive particles, and wherein the semiconductor device package assembly further comprises:
- a second interconnect structure electrically coupled to the second metallization structure at the contacting region exposed in the recess, the second interconnect structure having a second set of discrete conductive particles electrically coupled to one another;
- a second semiconductor device package having a third metallization structure electrically coupled to the second interconnect structure;
- a second thermoset structure between the first and second semiconductor device package, wherein the second set of conductive particles are in the second thermoset structure.

* * * * *